US010798235B2

(12) United States Patent
Tsai et al.

(10) Patent No.: US 10,798,235 B2
(45) Date of Patent: Oct. 6, 2020

(54) MODULAR MOBILE DEVICE SIDE BAR/BUTTONS

(71) Applicant: Intel Corporation, Santa Clara, CA (US)

(72) Inventors: Simon Tsai, Taoyuan County (TW); Tim Liu, New Taipei (TW); Gavin Sung, New Taipei (TW); Jeff Ku, Taipei (TW); Simon S. Yuan, Taoyuan (TW)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/088,584

(22) PCT Filed: Apr. 1, 2016

(86) PCT No.: PCT/US2016/025584
§ 371 (c)(1),
(2) Date: Sep. 26, 2018

(87) PCT Pub. No.: WO2017/171839
PCT Pub. Date: Oct. 5, 2017

(65) Prior Publication Data
US 2019/0116253 A1 Apr. 18, 2019

(51) Int. Cl.
H04M 1/23 (2006.01)
G06F 1/16 (2006.01)
(Continued)

(52) U.S. Cl.
CPC .......... H04M 1/236 (2013.01); G06F 1/1632 (2013.01); H04M 1/0281 (2013.01);
(Continued)

(58) Field of Classification Search
CPC .. H04M 1/236; H04M 1/0281; H04M 1/0283; H04M 1/72575; G06F 1/1632; H05K 5/0086; H05K 5/0221
(Continued)

(56) References Cited

U.S. PATENT DOCUMENTS

2002/0042291 A1* 4/2002 Lahteenmaki ...... H04M 1/0202
455/566
2004/0204132 A1* 10/2004 Idani ..................... G06F 1/1601
455/566
(Continued)

FOREIGN PATENT DOCUMENTS

JP 2010268413 A 11/2010
JP 2012191292 A 10/2012
WO WO-2017171839 10/2017

OTHER PUBLICATIONS

Google translation of JP2010268413A (7 pages).*
(Continued)

Primary Examiner — Mong-Thuy T Tran
(74) Attorney, Agent, or Firm — Schwegman Lundberg & Woessner, P.A.

(57) ABSTRACT

A mobile device having an internal frame and a sidebar configured to be coupled to the internal frame. The sidebar can include at least one button positioned in a button configuration on an exterior face of the sidebar and a sidebar contact positioned on an interior face of the sidebar. The sidebar can be positioned to interface with a frame contact when the sidebar is coupled to the internal frame. The frame can be operably coupled to a controller for a mobile device such that coupling the sidebar contact to the frame contact operably connects the at least one button of the sidebar to the controller. The sidebar can be exchanged with or decoupled (Continued)

from the frame and replaced with a second sidebar having a different button configuration from the original sidebar.

24 Claims, 7 Drawing Sheets

(51) Int. Cl.
  *H04M 1/02*    (2006.01)
  *H05K 5/00*    (2006.01)
  *H05K 5/02*    (2006.01)
  *H04M 1/725*   (2006.01)

(52) U.S. Cl.
  CPC ......... *H05K 5/0086* (2013.01); *H05K 5/0221* (2013.01); *H04M 1/0283* (2013.01); *H04M 1/72575* (2013.01)

(58) Field of Classification Search
  USPC ...................................................... 455/575.1
  See application file for complete search history.

(56) References Cited

U.S. PATENT DOCUMENTS

| | | | |
|---|---|---|---|
| 2007/0287391 A1* | 12/2007 | Hofer | G06F 3/0219 455/90.3 |
| 2009/0159412 A1 | 6/2009 | Liu et al. | |
| 2011/0053661 A1* | 3/2011 | Chu | G06F 1/1626 455/575.1 |
| 2014/0071056 A1* | 3/2014 | Liu | G06F 3/0235 345/169 |
| 2014/0080541 A1* | 3/2014 | Son | H04M 1/026 455/556.1 |
| 2014/0181746 A1* | 6/2014 | Lo | G06F 3/04886 715/835 |
| 2014/0335916 A1 | 11/2014 | Thorson et al. | |
| 2015/0109207 A1* | 4/2015 | Li | H04M 1/23 345/158 |
| 2015/0208896 A1* | 7/2015 | Willey | C11D 11/007 134/1 |
| 2018/0136776 A1* | 5/2018 | Xie | G06F 3/044 |

OTHER PUBLICATIONS

"International Application Serial No. PCT/US2016/025584, International Search Report dated Dec. 29, 2016", 3 pgs.

"International Application Serial No. PCT/US2016/025584, Written Opinion dated Dec. 29, 2016", 8 pgs.

* cited by examiner

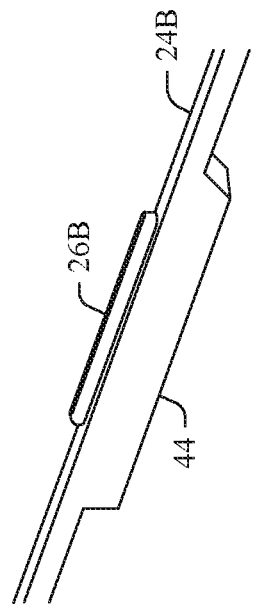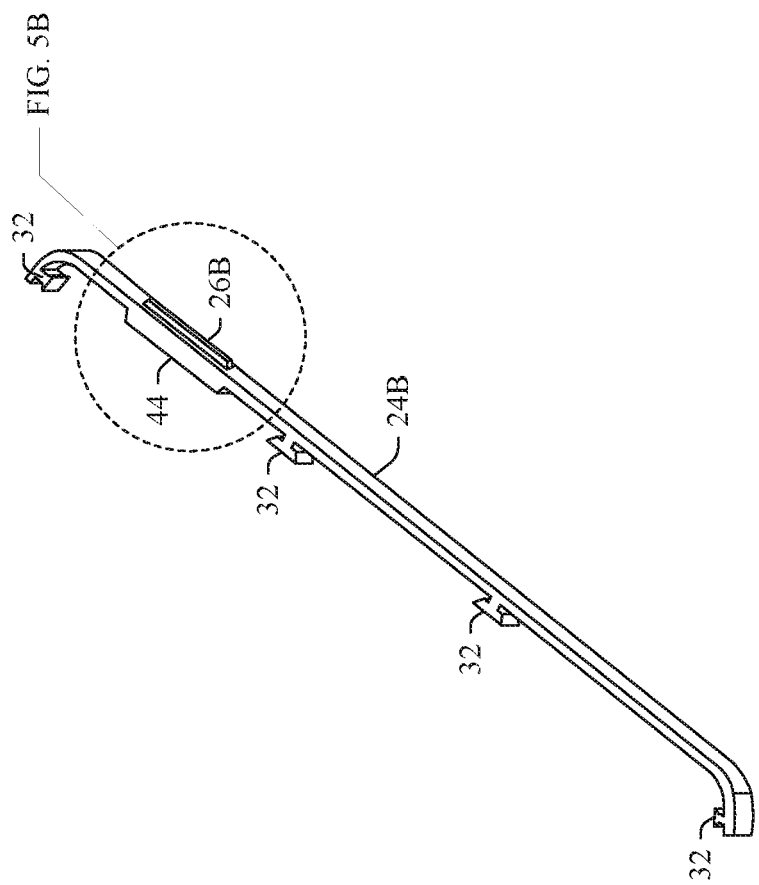

MODULAR MOBILE DEVICE SIDE BAR/BUTTONS

CLAIM OF PRIORITY

This patent application is a U.S. National Stage Application under 35 U.S.C. 371 from International Application No. PCT/US2016/025584, filed Apr. 1, 2016, published as WO 2017/171839, which is incorporated herein by reference.

TECHNICAL FIELD

This document pertains generally, but not by way of limitation, to mobile devices having modular side bar/buttons and related methods.

BACKGROUND

Many mobile phones, particularly smart phones, have a large touch screen display surrounded by a bezel. The touch screen can be manipulated to operate by touch to operate the mobile phone. Mechanical buttons are positioned on the bezel to supplement the touch screen and provide additional functionality to the mobile phone. Positioning the mechanical buttons on the bezel allows a user to grip the mobile phone with the fingers of a first hand to manipulate the touch screen with the fingers of the second hand while operating the bezel button with the first hand.

A common configuration is providing at least two bezel buttons on one side of the touch screen and a bezel button on the other side of the touch screen such that the bezel buttons are positioned to be manipulated by the fore finger, middle finger and/or thumb of the left hand. In this configuration, the more commonly dominant right hand is freed to operate the touch screen display. While this configuration optimizes two handed control of the mobile phone for a right handed individual, individuals who are left hand dominant or prefer using a mobile phone in a left handed configuration cannot efficiently use the mobile phone with two hands.

While mobile phones can be manufactured in both left-handed and right-handed configurations, the production of two sets of mobile phones can be costly and inefficient as estimating the appropriate amount of each configuration can be difficult. A primary aesthetic consideration of mobile phone design is minimizing the overall size of the phone such that the bezel closely approximates the outer edge of the touch screen display. Similarly, a related aesthetic consideration of mobile phone is minimizing the thickness of the phone and correspondingly, the width of the bezel. The narrow dimensions often prevent configuring a mobile phone to be reconfigured in either left handed or right handed configuration.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 6A is an exploded rear perspective view of a sidebar according to an example of the present disclosure.

FIG. 6B is a perspective view of a mechanical button of a sidebar according to an example of the present disclosure.

DETAILED DESCRIPTION

The present inventors have recognized, among other things, that a problem to be solved can be providing or reconfiguring mobile devices into different mechanical button configurations. In an example, the present subject matter can provide a solution to this problem, such as by providing an internal frame for a mobile device and a sidebar configured to be coupled to the internal frame. The sidebar can include at least one button positioned in a button configuration on an exterior face of the sidebar and a sidebar contact positioned on an interior face of the sidebar. The sidebar can be positioned to interface with a frame contact when the sidebar is coupled to the internal frame. The frame can be operably coupled to a controller for a mobile device such that coupling the sidebar contact to the frame contact operably connects the at least one button of the sidebar to the controller. In an example, the sidebar can be exchanged with or decoupled from the frame and replaced with a second sidebar having a different button configuration from the original sidebar.

In an example, the mobile device can be provided with an internal frame, a first sidebar having a first button configuration, and a second sidebar having a second button configuration, wherein the first button configuration differs from the second button configuration. The internal frame can include a left frame contact and a right frame contact. The first sidebar can have a first sidebar contact positioned to contact one of the left frame contact and the right frame contact when the first sidebar is coupled to the internal frame. The second sidebar can have a second sidebar contact positioned to contact the other of the left frame contact and the right frame contact when the second sidebar is coupled to the internal frame. The first sidebar and the second sidebar can be mirrored such that the first sidebar and the second sidebar are interchangeable to change the mobile device between a left handed configuration and a right handed configuration.

This overview is intended to provide an overview of subject matter of the present patent application. It is not intended to provide an exclusive or exhaustive explanation of the present subject matter. The detailed description is included to provide further information about the present patent application.

Figure 1A:
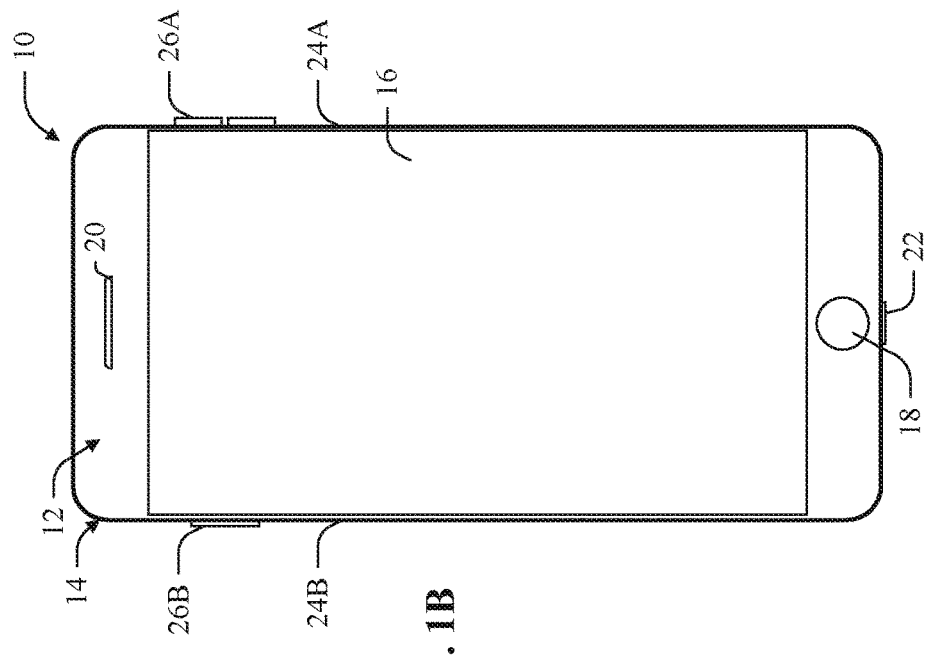
FIG. 1A is a front view of a mobile device in a right handed configuration according to an example of the present disclosure.
Figure 1B:
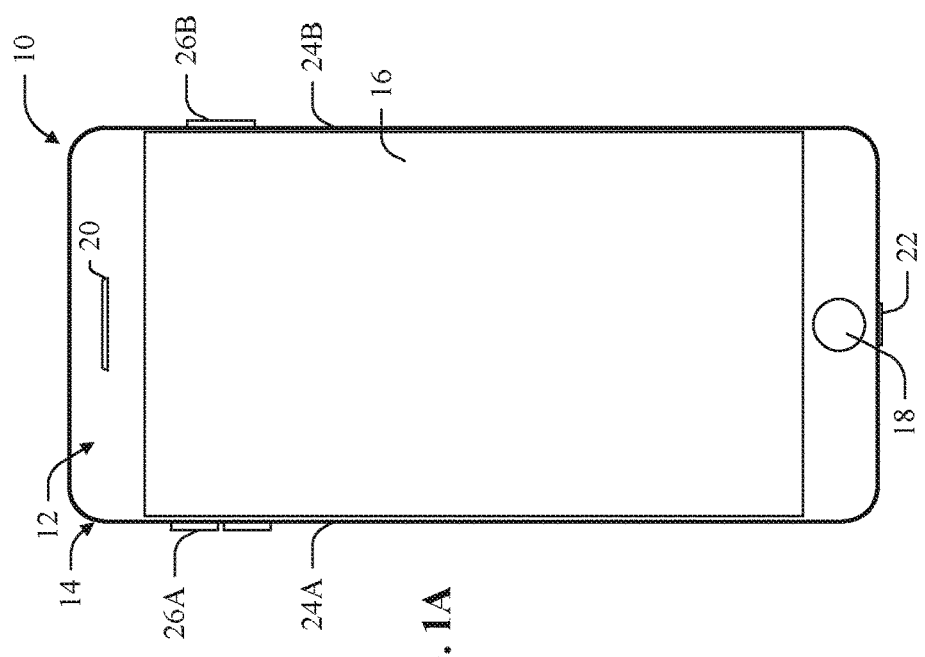
FIG. 1B is a front view of a mobile device in a left handed configuration according to an example of the present disclosure.

As depicted in FIGS. 1A-1B, a mobile device 10, according to an example of the present disclosure, can include a planar device body 12 and a bezel portion 14 arranged around an outer edge of the device body 12. The planar device body 12 can be configured to receive a touch screen 16 and at least one integrated button 18. In at least one example, the planar device body 12 can define at least one speaker slot 20 for transmitting sound through the planar device body 12 from a speaker contained within the planar device body 12. The bezel portion 14 can include a charging port 22 for receiving a charging cable to power the mobile device 10. The positioning of the touch screen 16, the at least one integrated button 18, the at least one speaker slot 20, and the charging port 22 depicted in FIGS. 1A-1B are not intended to be limiting and it is contemplated that the features can be positioned in a plurality of positions on the planar device body 12 and the bezel portion 14. In addition, in at least one example, one or more of the elements may be omitted from the planar device body 12, for example, a charging port 22 may be omitted when inductive charging is used.

Figure 2:
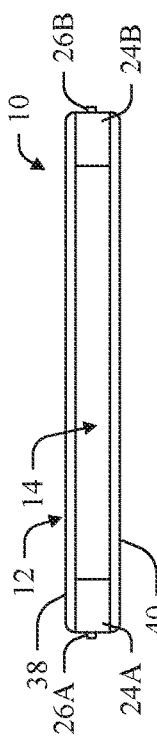
FIG. 2 is a top view of a mobile device according to an example of the present disclosure.

As depicted in FIGS. 1A-1B and 2, in an example, the bezel portion 14 can include a first sidebar 24A and a second sidebar 24B. The first sidebar 24A can have at least one first button 26A arranged in a first button configuration. The second sidebar 24B can have at least one second button 26B arranged in a second button configuration. As depicted in FIGS. 1A-1B, the first button configuration is a two button configuration and the second button configuration is a single button configuration, the first and second button configurations can include different number of buttons, differently sized buttons, and differently spaced buttons. The sidebars 24A, 24B can be coupled to the planar device body 12 to position the at least one first button 26A and the at least one second button 26B in a first configuration as depicted in FIG. 1A. The sidebars 24A, 24B can be interchangeably coupled to the planar device body 12 in a reversed configuration to position the at least one first button 26A and the at least one second button 26B in a second configuration as depicted in FIG. 1B. Alternatively, or in addition, the first sidebar 24A or second sidebar 24B may use other types of physical input devices, such as rotary dials, rocker buttons, sliding switches, and the like.

Figure 3:
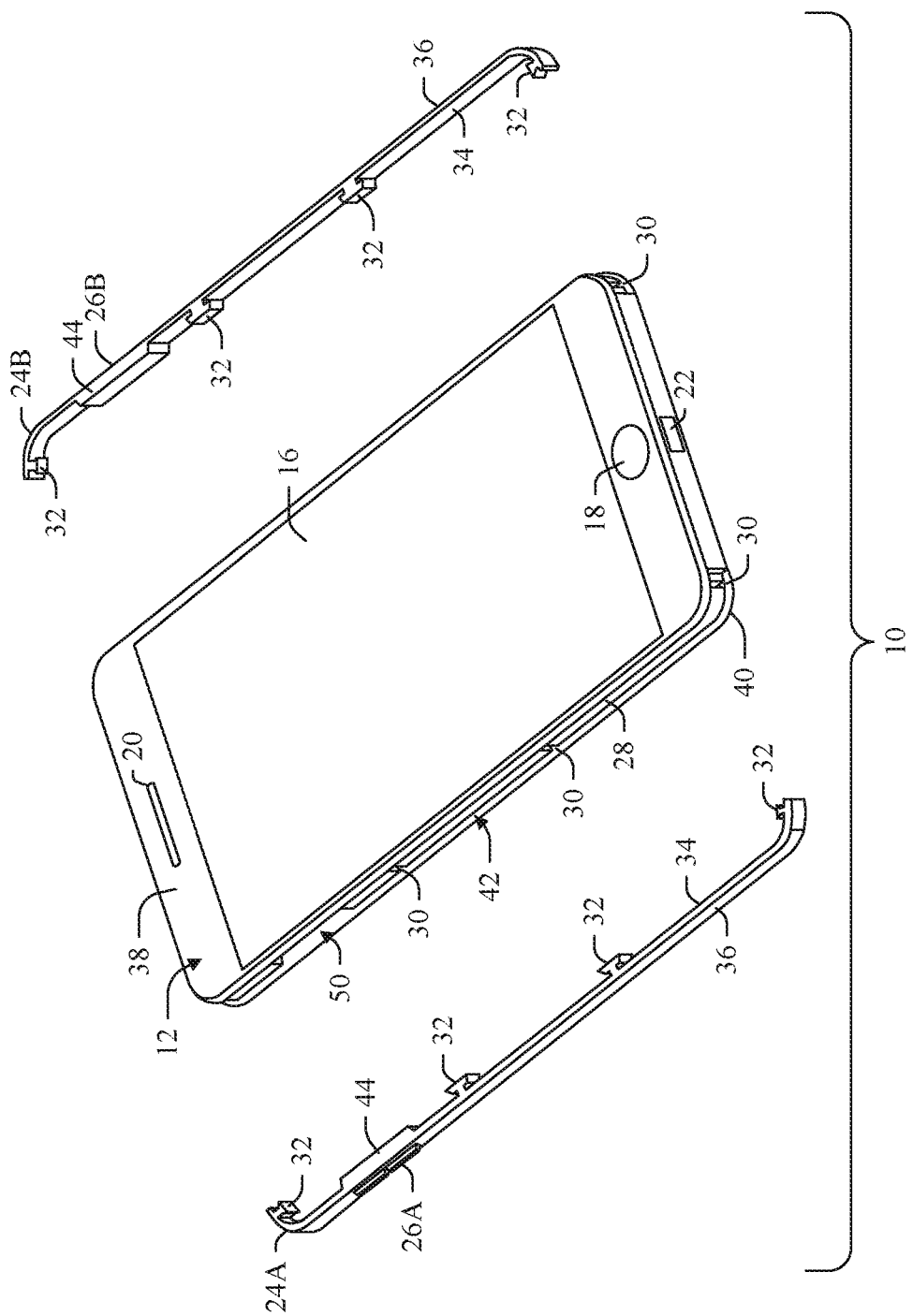
FIG. 3 is a front perspective view of a mobile device with the modular side bars decoupled according to an example of the present disclosure.
Figure 4:
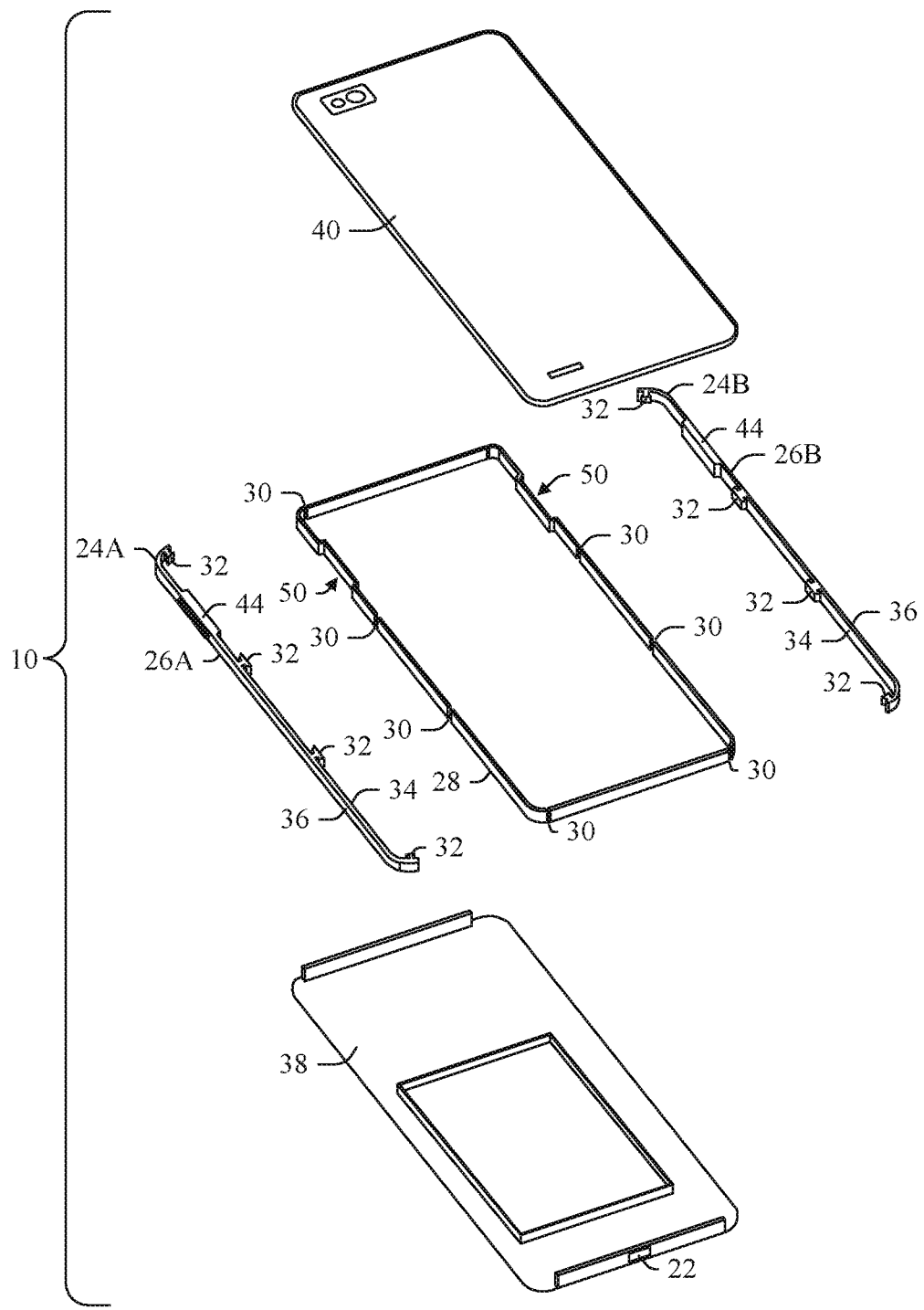
FIG. 4 is an exploded rear perspective view of a mobile device according to an example of the present disclosure.
Figures 5A, 5B:
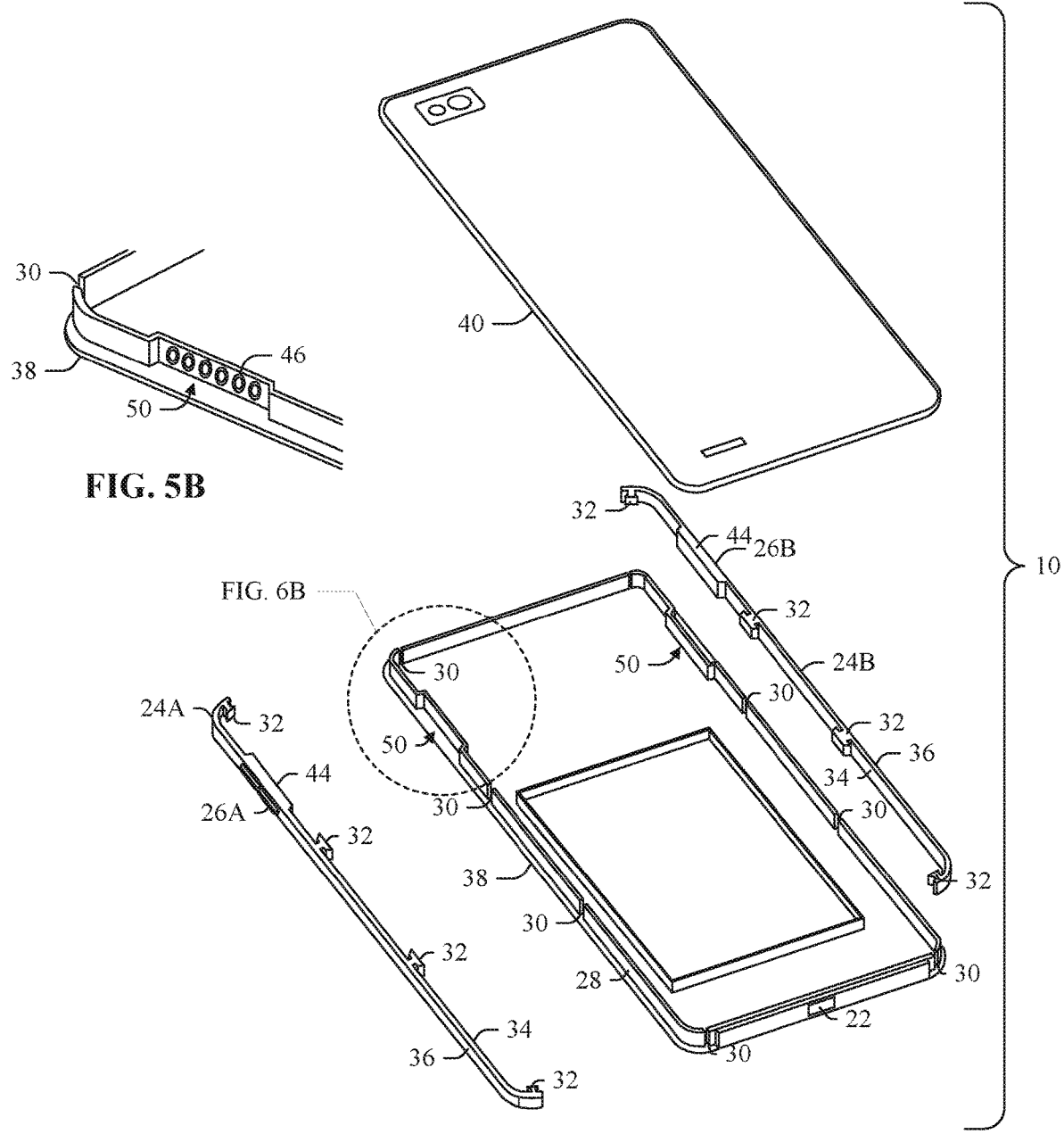
FIG. 5A is an exploded rear perspective view of a mobile device according to an example of the present disclosure.
FIG. 5B is a perspective view of a frame contact according to an example of the present disclosure.

As depicted in FIGS. 2-4, 5A-5B, and 8A-8B, in an example, the planar device body 12 can include a frame 28 configured to receive the sidebars 24A, 24B. The frame 28 can include at least one sidebar mount feature 30. In this configuration, each sidebar 24A, 24B can include at least one locking feature 32 engagable to the at least one sidebar mount feature 30 to secure the corresponding sidebar 24A, 24B to the frame 28. The at least one locking feature 32 can be disengaged from the sidebar mount feature 30 to permit the corresponding sidebars 24A, 24B to be removed from the frame 28. In an example, the frame 28 can include at least one locking feature 32 on at least two opposing sides of the frame 28 such that the sidebars 24A, 24B can interchangeably mounted to the opposing sides of the frame 28. As depicted in FIGS. 3-4 and 5A, in an example, each sidebar 24A, 24B can include an inner surface 34 and an exterior surface 36, where the at least one locking feature 32 is positioned on the frame 28 such that the exterior surface 36 defines a side portion of the bezel portion 14 when the corresponding sidebar 24 is coupled to the frame 28. As depicted in FIG. 3, each sidebar 24A, 24B can include a curved portion such that the sidebars 24A, 24B can define a corner portion of the bezel portion 24 when coupled to the frame 28.

As depicted in FIGS. 4, 5A, and 8A-8B, in an example, the at least one locking feature 32 can comprise a t-shaped locking feature 32 and the sidebar mount feature 30 can comprise a slot, wherein the at least one locking feature 32 can be slid into the slot to engage the corresponding sidebar 24A, 24B to the frame 28. In at least one example, the planar device body 12 can include a front plate 38 and a rear plate 40 as depicted in FIGS. 2-4 and 5A-5B. In this configuration, the frame 28 can be coupled to the front plate 38, as depicted in FIGS. 4 and 5A, or the rear plate 40. The t-shaped locking feature 32 of the corresponding sidebar 24A, 24B can be slid into the slot sidebar mount feature 30 to engage the attached front plate 38 or rear plate 40. The unmounted front plate 38 or rear plate 40 can be mounted to the frame 28 opposite the mounted front plate 38 or rear plate 40 to retain the engagement of the sidebars 24A, 24B to the frame 28. In an example, the front plate 38 and rear plate 40 are sized to define a channel 42 for receiving the sidebar 24A, 24B as illustrated in FIG. 3. In this configuration, the exterior surface 36 can correspond to the outer edges of the front plate 38 and the rear plate 40.

As depicted in FIG. 6A-6B, each sidebar 24A, 24B can include a button portion 44 defining an internal space for receiving the at least one first button 26A or the at least one second button 26B. The internal space can include a flex switch completes a circuit upon depressing of the corresponding first button 26A or second button 26B into the internal space and disconnects the circuit upon release of the first button 26A or second button 26B to permit movement from the internal space. The flex switch translates the mechanical motion of the at least one first button 26A or the at least one second button 26B to an electric signal that can be communicated to a controller or other circuit. In an example, the button portion 44 can include a transmitter to wirelessly transmit an electric signal to the controller. In an example, a metal dome can be positioned in the internal space such that depressing of the corresponding first button 26A or second button 26B provides an auditory and/or tactile click.

Figure 7:
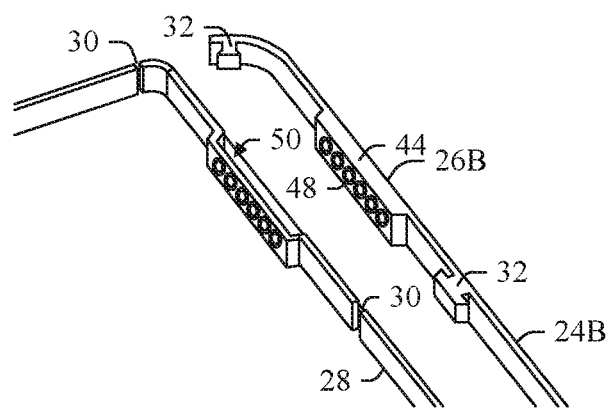
FIG. 7 is a partial perspective view illustrating interfacing a mechanical button of a sidebar with a frame according to an example of the present disclosure.

As depicted in FIG. 5A, in an example, the frame 28 can include at least one frame contact 46. The frame contact 46 can be operably connected to a controller or other circuit contained within the frame 28. The frame 28 can define an opening through the frame 28 through which wiring can be connected to the frame contact 46. In this configuration, each sidebar 24A, 24B can include at least one sidebar contact 48 on the inner surface 34 of the sidebar 24A, 24B. As depicted in FIG. 7, each sidebar contact 48 can be configured to interface with the at least one frame contact 46 to operably connect the first button 26A or the second button 26B to the frame 28 and correspondingly the controller or other circuit.

Figure 8A:
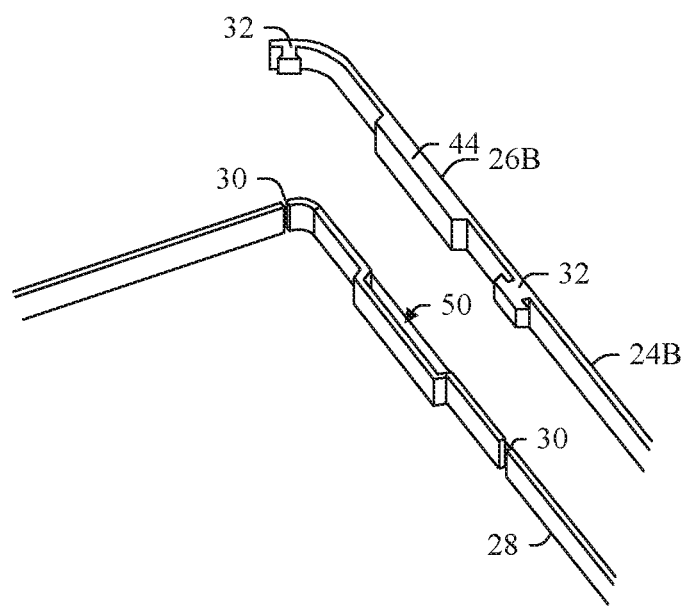
FIG. 8A is a partial perspective view illustrating decoupling of a side bar to a frame according to an example of the present disclosure.
Figure 8B:
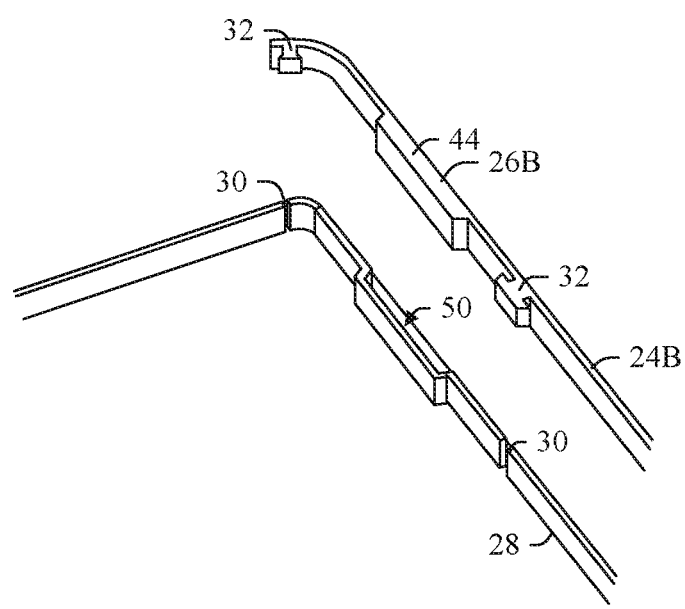
FIG. 8B is a partial perspective view illustrating coupling of a side bar to a frame according to an example of the present disclosure.

In an example, the frame 28 can define a recessed portion 50 at the at least one frame contact 46 for receiving the protruding button portion 44 as illustrated in FIG. 8B. In this configuration, the frame 28 at the recessed portion 50 guide each sidebar contact 48 into contact with the corresponding frame contact 46 to operably connect the button portion 44 to the circuitry connected to the sidebar contact 48. In at least one example, the dimensions of the button portion 44 can be the same for both the first sidebar 24A and the second sidebar 24B such that the first sidebar 24A and the second sidebar 24B can be interchangeably mounted to the frame 28. The circuitry contained in the frame 28 can be linked to a switch allowing physically reversing of the first sidebar 24A and the second sidebar 24B, while the button portion 44 of the corresponding first sidebar 24A and the second sidebar 24B to operate the same functions. The sidebar contacts 48 and the frame contacts 46 can be arranged in a universal pattern such that different sidebars 24A, 24B can be coupled to the frame 28 or exchanged without requiring the frame contacts 46 to match specific sidebar contact 48 patterns.

Figure 9:
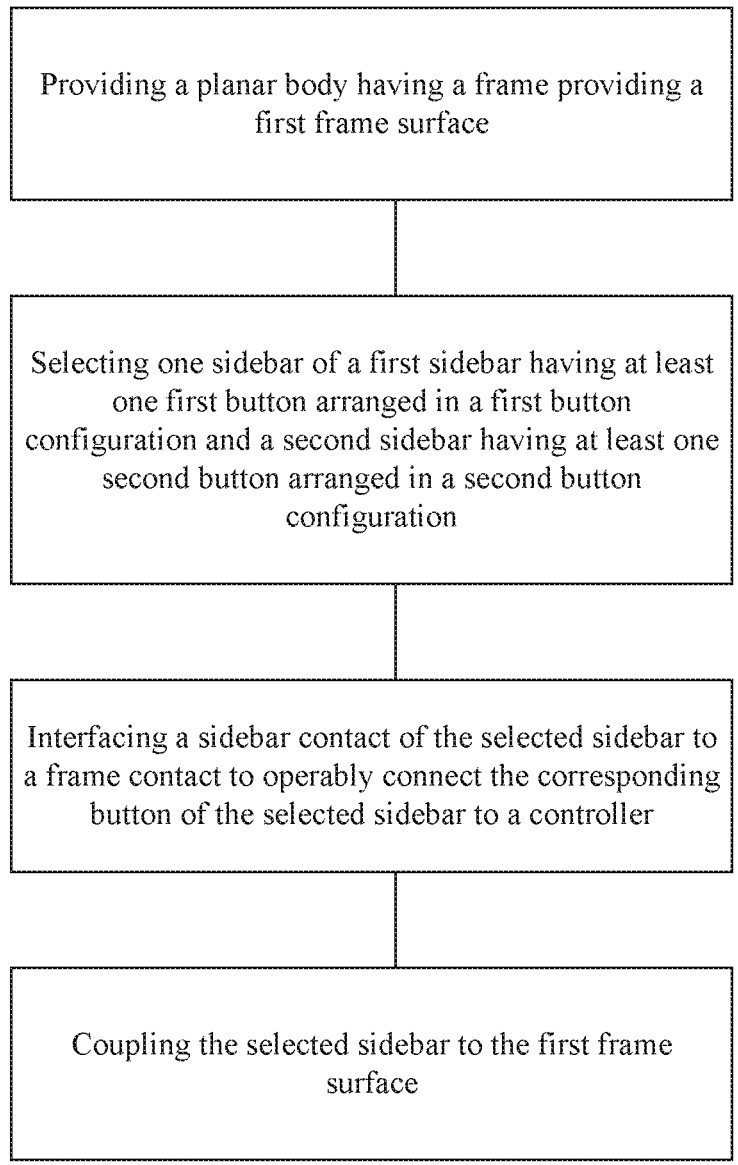
FIG. 9 is a schematic diagram of assembly a mobile device according to an example of the present disclosure.

As depicted in FIG. 9, in an example, a method of configuring buttons of a mobile device 10 can include providing a planar device body 12 having a frame 28 and a first sidebar 24A, wherein the first sidebar 24A has at least one first button 26A arranged in a first button configuration. The method can further include coupling at least one locking feature 32 on an exterior surface 36 of the first sidebar 24A to a corresponding sidebar mount feature 30 defined by the frame 28 to couple the first sidebar 24A to the frame 28. In an example, the method can further include coupling a front plate 38 and a rear plate 40 on opposing sides of the frame 28 to maintain engagement of the first sidebar 24A to the frame 28. The method can further include decoupling the first side bar 24A from the frame 28 and coupling a second sidebar 24B to the frame 28, where the second sidebar 24B includes at least one second button 26B arranged in a second button configuration different from the first button configuration.

In an example, each sidebar 24A, 24B can include a button portion 44 having at least one sidebar contact 48 on an inner surface 34 of the sidebar 24A, 24B. In this configuration, the method can further include coupling the at least one sidebar contact 48 to a frame contact 28 operably coupled to a controller. The method can further include depressing the first button 26A or the second button 26B to transmit a signal through at least one of the sidebar contacts 48 to the controller or switch through the corresponding frame contact 28.

VARIOUS NOTES & EXAMPLES

Example 1 is a mobile device, comprising: a planar device body having a first side; a first sidebar configured to be coupled to the first side of the planar device body, the first sidebar having at least one first button arranged in a first button configuration; and a second sidebar having at least one second button arranged in a second button configuration different from the first button configuration; wherein the second sidebar is configured to be coupled to a first side of the planar device body.

In Example 2, the subject matter of Example 1 optionally includes, the planar device body further comprises: a frame having a first frame surface positioned adjacent the first side of the planar device body; wherein the first frame surface is configured to receive at least one of the first sidebar and the second sidebar to couple the at least one of the first sidebar and the second sidebar to the first side of the planar device body.

In Example 3, the subject matter of Example 2 optionally includes, wherein the first sidebar and the second sidebar each further comprise: an inner surface having at least one locking feature; and an exterior surface.

In Example 4, the subject matter of Example 3 optionally includes, wherein the frame further comprises at least one sidebar mount feature positioned on the first frame surface; wherein the at least one locking feature is engageable to the at least one sidebar mount feature to couple the at least one of the first sidebar and the second sidebar to the first side of the frame.

In Example 5, the subject matter of Example 4 optionally includes, wherein the at least one locking feature comprises a t-shaped feature and the at least one sidebar mount feature comprises a slot for slidably receive the t-shaped feature.

In Example 6, the subject matter of any one or more of Examples 4-5 optionally include, wherein the planar device body further comprises: a front plate mountable to the frame; and a rear plate mountable to the frame opposite to the front plate to maintain engagement of the at least one locking feature to the at least one sidebar mount feature.

In Example 7, the subject matter of Example 6 optionally includes, wherein at least one of the front plate and the rear plate is mounted to the frame prior to engagement of the at least one locking feature to the at least one sidebar mount feature; wherein the other of the front plate and the rear plate is mounted to the frame after to engagement of the at least one locking feature to the at least one sidebar mount feature to maintain engagement of the at least one locking feature to the at least one sidebar mount feature.

In Example 8, the subject matter of any one or more of Examples 6-7 optionally include, wherein the front plate and the rear plate are sized to extend outward from the frame to define a channel adjacent to the first side of the frame; wherein the at least one of the first sidebar and the second sidebar are received within the channel when the at least one of the first sidebar and the second sidebar is coupled to the first side of the frame.

In Example 9, the subject matter of Example 8 optionally includes, wherein the mobile device further comprises a bezel portion arranged around a portion of an outer edge of the planar device body; wherein receiving the at least one of the first sidebar and the second sidebar aligns the exterior surface to the bezel portion.

In Example 10, the subject matter of any one or more of Examples 8-9 optionally include, wherein the at least one of the first sidebar and the second sidebar each further comprise a curved portion defining a corner of the bezel portion.

In Example 11, the subject matter of any one or more of Examples 8-10 optionally include, wherein the bezel portion includes an end portion positioned over the frame.

In Example 12, the subject matter of any one or more of Examples 8-11 optionally include, wherein the end portion includes at least one charging port.

In Example 13, the subject matter of any one or more of Examples 3-12 optionally include, wherein the at least one of the first sidebar and the second sidebar each further comprise: a button portion defining an internal space; wherein the at least one first button and the at least one second button are configured to be depressed to move the corresponding button at least partially into the internal space.

In Example 14, the subject matter of Example 13 optionally includes, wherein a metal dome is positioned in the internal space such that depressing the corresponding button actuates the metal dome to produce at least one of an auditory and a tactile click.

In Example 15, the subject matter of any one or more of Examples 13-14 optionally include, wherein a flex switch is positioned within the internal space such that depressing the corresponding button actuates the flex switch to complete a circuit.

In Example 16, the subject matter of Example 15 optionally includes, wherein the button portion further comprises: at least one sidebar contact positioned on the inner surface of the at least one of the first sidebar and the second sidebar.

In Example 17, the subject matter of Example 16 optionally includes, wherein the frame further comprises: at least one frame contact is operably connected to a controller and positioned to engage the at least one sidebar contact when the at least one of the first sidebar and the second sidebar is coupled to the frame; wherein depressing the corresponding button signals the controller through the at least one sidebar contact engaged to the at least one frame contact.

In Example 18, the subject matter of Example 17 optionally includes, wherein the frame further comprises: a recessed portion for receiving the button portion.

In Example 19, the subject matter of Example 18 optionally includes, wherein the recessed portion includes at least one angled portion for guiding the at least one frame contact into engagement with the at least one sidebar contact.

In Example 20, the subject matter of any one or more of Examples 2-19 optionally include, wherein the frame further comprises: a second frame surface positioned opposite the first frame surface; wherein the second frame surface corresponds to a second side of the planar device body opposite the first side of the planar device body.

In Example 21, the subject matter of Example 20 optionally includes, wherein the second frame surface is configured to receive the other of the first sidebar and the second sidebar to couple the other of the first sidebar and the second sidebar to the second side of the planar device body.

In Example 22, the subject matter of Example 21 optionally includes, wherein the first side of the planar device corresponds to a left side of the planar device and the second side of the planar device corresponds to a right side of the planar device; wherein reversing the first sidebar from the first side to the second side and the second sidebar from the second side to the first side reverses the mobile device from a left-handed configuration to a right-handed configuration.

In Example 23, the subject matter of any one or more of Examples 20-22 optionally include, wherein the planar device body further comprises: a touch screen positioned between the first and second side of the planar device body.

In Example 24, the subject matter of Example 23 optionally includes, wherein the planar device body further comprises: at least one integrated button adjacent to the touch screen.

In Example 25, the subject matter of any one or more of Examples 20-24 optionally include, wherein the planar device body defines at least one speaker slot.

Example 26 is a method for providing a mobile device having a desired button configuration, comprising: providing a planar device body having a first side; and coupling one of a first sidebar and a second sidebar to the first side of the planar device body; wherein the first sidebar having at least one first button arranged in a first button configuration and the second sidebar having at least one second button arranged in a second button configuration different from the first button configuration.

In Example 27, the subject matter of Example 26 optionally includes, wherein the planar device body further comprises a frame having a first frame surface positioned adjacent the first side of the planar device body.

In Example 28, the subject matter of Example 27 optionally includes, further comprising: coupling one of the first sidebar and the second sidebar to the first frame surface to couple the one of the first sidebar and the second sidebar to the first side of the planar device body.

In Example 29, the subject matter of Example 28 optionally includes, wherein the frame further comprises a second frame surface positioned opposite the first frame surface, wherein the second frame surface corresponds to a second side of the planar device body opposite the first side of the planar device body.

In Example 30, the subject matter of Example 29 optionally includes, further comprising: coupling the other of the first sidebar and the second sidebar to the second frame surface to couple the other of the first sidebar and the second sidebar to the second side of the planar device body.

In Example 31, the subject matter of Example 30 optionally includes, wherein the first sidebar and the second sidebar are interchangeably connected to the first and second frame surfaces.

In Example 32, the subject matter of Example 31 optionally includes, wherein the first side of the planar device corresponds to a left side of the planar device and the second side of the planar device corresponds to a right side of the planar device.

In Example 33, the subject matter of Example 32 optionally includes, further comprising: reversing the first sidebar from the first side to the second side and the second sidebar from the second side to the first side to reverse the mobile device from a left-handed configuration to a right-handed configuration.

In Example 34, the subject matter of Example 33 optionally includes, wherein the planar device body further comprises: a touch screen positioned between the first and second side of the planar device body.

In Example 35, the subject matter of any one or more of Examples 27-34 optionally include, wherein the first sidebar and the second sidebar each further comprise: an inner surface having at least one locking feature; and an exterior surface.

In Example 36, the subject matter of Example 35 optionally includes, further comprising: engaging the at least one locking feature to the at least one sidebar mount feature positioned on the first frame surface.

In Example 37, the subject matter of any one or more of Examples 35-36 optionally include, wherein the at least one locking feature comprises a t-shaped feature and the at least one sidebar mount feature comprises a slot for slidably receive the t-shaped feature to engage the at least one locking feature to the at least one sidebar mount feature.

In Example 38, the subject matter of any one or more of Examples 36-37 optionally include, further comprising: mounting a front plate to the frame; and mounting a rear plate to the frame opposite to the front plate; wherein the front plate and the rear plate cooperate to maintain engagement of the at least one locking feature to the at least one sidebar mount feature.

In Example 39, the subject matter of Example 38 optionally includes, wherein the at least one of the front plate and the rear plate is mounted to the frame prior to engagement of the at least one locking feature to the at least one sidebar feature; wherein the other of the front plate and the rear plate is mounted to the frame after to engagement of the at least one locking feature to the at least one sidebar mount feature to maintain engagement of the at least one locking feature to the at least one sidebar mount feature.

In Example 40, the subject matter of any one or more of Examples 38-39 optionally include, further comprising: sizing the front plate and the rear plate such that the front plate and the rear plate are sized to extend outward from the frame to define a channel adjacent to the front side of the frame; and receiving the at least one of the first sidebar and the second sidebar within the channel when the at least one of the first sidebar and the second sidebar is coupled to the first side of the frame.

In Example 41, the subject matter of Example 40 optionally includes, wherein the mobile device further comprises a bezel portion arranged around a portion of an outer edge of the planar device body.

In Example 42, the subject matter of Example 41 optionally includes, further comprising: aligning the exterior surface of the at least one first sidebar and the second sidebar with the bezel portion.

In Example 43, the subject matter of any one or more of Examples 41-42 optionally include, wherein the at least one of the first sidebar and the second sidebar each further comprise a curved portion defining a corner of the bezel portion.

In Example 44, the subject matter of any one or more of Examples 41-43 optionally include, further comprising: positioning an end portion of the bezel portion over the frame.

In Example 45, the subject matter of any one or more of Examples 28-44 optionally include, wherein the at least one of the first sidebar and the second sidebar each further comprise: a button portion defining an internal space; wherein the at least one first button and the at least one second button are configured to be depressed to move the corresponding button at least partially into the internal space.

In Example 46, the subject matter of Example 45 optionally includes, further comprising: positioning a flex switch within the internal space; and depressing the corresponding button to actuate the flex switch to complete a circuit.

In Example 47, the subject matter of Example 46 optionally includes, wherein the button portion further comprises: at least one sidebar contact positioned on the inner surface of the at least one of the first sidebar and the second sidebar.

In Example 48, the subject matter of Example 47 optionally includes, further comprising: connecting at least one frame contact of the frame to a controller; and positioning the at least one frame contact to engage the at least one sidebar contact when the at least one of the first sidebar and the second sidebar is coupled to the frame; depressing the corresponding button to signal the controller through the at least one sidebar contact engaged to the at least one frame contact.

In Example 49, the subject matter of Example 48 optionally includes, further comprising: receiving the button portion within a recessed portion of the frame.

In Example 50, the subject matter of Example 49 optionally includes, further comprising: guiding the at least one frame contact into engagement with the at least one sidebar contact with at least one angled portion of the recessed portion.

Example 51 is an apparatus comprising means for performing any of the methods of Examples 26-50.

Example 52 is at least one machine-readable medium including instructions, which when executed by a machine, cause the machine to perform operations of any of the methods of Examples 26-50.

Example 53 is an apparatus for providing a mobile device having a desired button configuration, comprising: means for providing a planar device body having a first side; and means for coupling one of a first sidebar and a second sidebar to the first side of the planar device body; wherein the first sidebar having at least one first button arranged in a first button configuration and the second sidebar having at least one second button arranged in a second button configuration different from the first button configuration.

In Example 54, the subject matter of Example 53 optionally includes wherein the planar device body further comprises a frame having a first frame surface positioned adjacent the first side of the planar device body.

In Example 55, the subject matter of Example 54 optionally includes, further comprising: means for coupling one of the first sidebar and the second sidebar to the first frame surface to couple the one of the first sidebar and the second sidebar to the first side of the planar device body.

In Example 56, the subject matter of Example 55 optionally includes, wherein the frame further comprises a second frame surface positioned opposite the first frame surface, wherein the second frame surface corresponds to a second side of the planar device body opposite the first side of the planar device body.

In Example 57, the subject matter of Example 56 optionally includes, further comprising: means for coupling the other of the first sidebar and the second sidebar to the second frame surface to couple the other of the first sidebar and the second sidebar to the second side of the planar device body.

In Example 58, the subject matter of Example 57 optionally includes, wherein the first sidebar and the second sidebar are interchangeably connected to the first and second frame surfaces.

In Example 59, the subject matter of Example 58 optionally includes, wherein the first side of the planar device corresponds to a left side of the planar device and the second side of the planar device corresponds to a right side of the planar device.

In Example 60, the subject matter of Example 59 optionally includes, wherein reversing the first sidebar from the first side to the second side and the second sidebar from the second side to the first side to reverse the mobile device from a left-handed configuration to a right-handed configuration.

In Example 61, the subject matter of Example 60 optionally includes, wherein the planar device body further comprises: a touch screen positioned between the first and second side of the planar device body.

In Example 62, the subject matter of any one or more of Examples 54-61 optionally include, wherein the first sidebar and the second sidebar each further comprise: an inner surface having at least one locking feature; and an exterior surface.

In Example 63, the subject matter of Example 62 optionally includes, further comprising: means for engaging the at least one locking feature to the at least one sidebar mount feature positioned on the first frame surface.

In Example 64, the subject matter of any one or more of Examples 62-63 optionally include, wherein the at least one locking feature comprises a t-shaped feature and the at least one sidebar mount feature comprises a slot for slidably receive the t-shaped feature to engage the at least one locking feature to the at least one sidebar mount feature.

In Example 65, the subject matter of any one or more of Examples 63-64 optionally include, further comprising: means for mounting a front plate to the frame; and means for mounting a rear plate to the frame opposite to the front plate; wherein the front plate and the rear plate cooperate to maintain engagement of the at least one locking feature to the at least one sidebar mount feature.

In Example 66, the subject matter of Example 65 optionally includes, wherein the at least one of the front plate and the rear plate is mounted to the frame prior to engagement of the at least one locking feature to the at least one sidebar feature; wherein the other of the front plate and the rear plate is mounted to the frame after to engagement of the at least one locking feature to the at least one sidebar mount feature to maintain engagement of the at least one locking feature to the at least one sidebar mount feature.

In Example 67, the subject matter of any one or more of Examples 65-66 optionally include, further comprising: means for sizing the front plate and the rear plate such that the front plate and the rear plate are sized to extend outward from the frame to define a channel adjacent to the front side of the frame; and means for receiving the at least one of the first sidebar and the second sidebar within the channel when the at least one of the first sidebar and the second sidebar is coupled to the first side of the frame.

In Example 68, the subject matter of Example 67 optionally includes, wherein the mobile device further comprises a bezel portion arranged around a portion of an outer edge of the planar device body.

In Example 69, the subject matter of Example 68 optionally includes, further comprising: means for aligning the exterior surface of the at least one first sidebar and the second sidebar with the bezel portion.

In Example 70, the subject matter of any one or more of Examples 68-69 optionally include, wherein the at least one of the first sidebar and the second sidebar each further comprise a curved portion defining a corner of the bezel portion.

In Example 71, the subject matter of any one or more of Examples 68-70 optionally include, further comprising: means for positioning an end portion of the bezel portion over the frame.

In Example 72, the subject matter of any one or more of Examples 55-71 optionally include, wherein the at least one of the first sidebar and the second sidebar each further comprise: a button portion defining an internal space; wherein the at least one first button and the at least one second button are configured to be depressed to move the corresponding button at least partially into the internal space.

In Example 73, the subject matter of Example 72 optionally includes, further comprising: means for positioning a flex switch within the internal space; and wherein depressing the corresponding button to actuate the flex switch to complete a circuit.

In Example 74, the subject matter of Example 73 optionally includes, wherein the button portion further comprises: at least one sidebar contact positioned on the inner surface of the at least one of the first sidebar and the second sidebar.

In Example 75, the subject matter of Example 74 optionally includes, further comprising: means for connecting at least one frame contact of the frame to a controller; and means for positioning the at least one frame contact to engage the at least one sidebar contact when the at least one of the first sidebar and the second sidebar is coupled to the frame; wherein depressing the corresponding button signals the controller through the at least one sidebar contact engaged to the at least one frame contact.

In Example 76, the subject matter of Example 75 optionally includes, further comprising: means for receiving the button portion within a recessed portion of the frame.

In Example 77, the subject matter of Example 76 optionally includes, further comprising: means for guiding the at least one frame contact into engagement with the at least one sidebar contact with at least one angled portion of the recessed portion.

Example 78 is a mobile device system, comprising: a planar device body having a first side; a first sidebar configured to be coupled to the first side of the planar device body, the first sidebar having at least one first button arranged in a first button configuration; a second sidebar having at least one second button arranged in a second button configuration different from the first button configuration, wherein the second sidebar is configured to be coupled to a first side of the planar device body; a controller configured to read computer readable instructions and configured to control operation of the sensor system, wherein the instructions for controlling operation of the sensor system comprises instructions for: receiving a control signal from manipulation of the corresponding button of the at least one of the first sidebar and the second sidebar coupled to the first side of the planar device body.

In Example 79, the subject matter of Example 78 optionally includes, the planar device body further comprises: a frame having a first frame surface positioned adjacent the first side of the planar device body; wherein the first frame surface is configured to receive at least one of the first sidebar and the second sidebar to couple the at least one of the first sidebar and the second sidebar to the first side of the planar device body.

In Example 80, the subject matter of Example 79 optionally includes, wherein the first sidebar and the second sidebar each further comprise: an inner surface having at least one locking feature; and an exterior surface.

In Example 81, the subject matter of Example 80 optionally includes, wherein the frame further comprises at least one sidebar mount feature positioned on the first frame surface; wherein the at least one locking feature is engageable to the at least one sidebar mount feature to couple the at least one of the first sidebar and the second sidebar to the first side of the frame.

In Example 82, the subject matter of Example 81 optionally includes, wherein the at least one locking feature comprises a t-shaped feature and the at least one sidebar mount feature comprises a slot for slidably receive the t-shaped feature.

In Example 83, the subject matter of any one or more of Examples 81-82 optionally include, wherein the planar device body further comprises: a front plate mountable to the frame; and a rear plate mountable to the frame opposite to the front plate to maintain engagement of the at least one locking feature to the at least one sidebar mount feature.

In Example 84, the subject matter of Example 83 optionally includes, wherein at least one of the front plate and the rear plate is mounted to the frame prior to engagement of the at least one locking feature to the at least one sidebar mount feature; wherein the other of the front plate and the rear plate is mounted to the frame after to engagement of the at least one locking feature to the at least one sidebar mount feature to maintain engagement of the at least one locking feature to the at least one sidebar mount feature.

In Example 85, the subject matter of any one or more of Examples 83-84 optionally include, wherein the front plate and the rear plate are sized to extend outward from the frame to define a channel adjacent to the first side of the frame;

wherein the at least one of the first sidebar and the second sidebar are received within the channel when the at least one of the first sidebar and the second sidebar is coupled to the first side of the frame.

In Example 86, the subject matter of Example 85 optionally includes, wherein the mobile device further comprises a bezel portion arranged around a portion of an outer edge of the planar device body; wherein receiving the at least one of the first sidebar and the second sidebar aligns the exterior surface to the bezel portion.

In Example 87, the subject matter of any one or more of Examples 85-86 optionally include, wherein the at least one of the first sidebar and the second sidebar each further comprise a curved portion defining a corner of the bezel portion.

In Example 88, the subject matter of any one or more of Examples 85-87 optionally include, wherein the bezel portion includes an end portion positioned over the frame.

In Example 89, the subject matter of any one or more of Examples 85-88 optionally include, wherein the end portion includes at least one charging port.

In Example 90, the subject matter of any one or more of Examples 80-89 optionally include, wherein the at least one of the first sidebar and the second sidebar each further comprise: a button portion defining an internal space; wherein the at least one first button and the at least one second button are configured to be depressed to move the corresponding button at least partially into the internal space.

In Example 91, the subject matter of Example 90 optionally includes, wherein a metal dome is positioned in the internal space such that depressing the corresponding button actuates the metal dome to produce at least one of an auditory and a tactile click.

In Example 92, the subject matter of any one or more of Examples 90-91 optionally include, wherein a flex switch is positioned within the internal space such that depressing the corresponding button actuates the flex switch to complete a circuit.

In Example 93, the subject matter of Example 92 optionally includes, wherein the button portion further comprises: at least one sidebar contact positioned on the inner surface of the at least one of the first sidebar and the second sidebar.

In Example 94, the subject matter of Example 93 optionally includes, wherein the frame further comprises: at least one frame contact is operably connected to the controller and positioned to engage the at least one sidebar contact when the at least one of the first sidebar and the second sidebar is coupled to the frame; wherein the instructions for controlling operation of the sensor system comprises receiving the control signals from the depressing the corresponding button through the at least one sidebar contact engaged to the at least one frame contact.

In Example 95, the subject matter of Example 94 optionally includes, wherein the frame further comprises: a recessed portion for receiving the button portion.

In Example 96, the subject matter of Example 95 optionally includes, wherein the recessed portion includes at least one angled portion for guiding the at least one frame contact into engagement with the at least one sidebar contact.

In Example 97, the subject matter of any one or more of Examples 79-96 optionally include, wherein the frame further comprises: a second frame surface positioned opposite the first frame surface; wherein the second frame surface corresponds to a second side of the planar device body opposite the first side of the planar device body.

In Example 98, the subject matter of Example 97 optionally includes, wherein the second frame surface is configured to receive the other of the first sidebar and the second sidebar to couple the other of the first sidebar and the second sidebar to the second side of the planar device body.

In Example 99, the subject matter of Example 98 optionally includes, wherein the first side of the planar device corresponds to a left side of the planar device and the second side of the planar device corresponds to a right side of the planar device; wherein reversing the first sidebar from the first side to the second side and the second sidebar from the second side to the first side reverses the mobile device from a left-handed configuration to a right-handed configuration; wherein the instructions for controlling operation of the sensor system comprises: determining whether the first sidebar and the second sidebar are arranged in a left-handed configuration or a right handed configuration.

In Example 100, the subject matter of any one or more of Examples 97-99 optionally include, wherein the planar device body further comprises: a touch screen positioned between the first and second side of the planar device body.

In Example 101, the subject matter of Example 100 optionally includes, wherein the planar device body further comprises: at least one integrated button adjacent to the touch screen.

In Example 102, the subject matter of any one or more of Examples 97-101 optionally include, wherein the planar device body defines at least one speaker slot.

Each of these non-limiting examples can stand on its own, or can be combined in any permutation or combination with any one or more of the other examples.

The above detailed description includes references to the accompanying drawings, which form a part of the detailed description. The drawings show, by way of illustration, specific embodiments in which the present subject matter can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the present subject matter should be determined with reference to the appended claims, along with the full scope of equivalents to which such claims are entitled.

What is claimed is:

1. A mobile device, comprising:
   a planar device body having a first side and a second side opposite the first side;
   a first sidebar unit configured to be coupled to one of the first side of the planar device body or the second side of the planar device body, the first sidebar unit having a plurality of buttons arranged in a first button configuration;
   a second sidebar unit having at least one second button arranged in a second button configuration different from the first button configuration, wherein the second sidebar unit is configured to be coupled to the other of the first side or the second side of the planar device body; and
   a frame configured to receive the first sidebar unit and the second sidebar unit, the frame having a first frame contact on the first side of the planar device body and a second frame contact on the second side of the planar device body where each of the first frame contact and the second frame contact are configured to alternatively receive the plurality of buttons of the first sidebar unit and the at least one second button of the second sidebar unit.

2. The mobile device of claim 1, wherein the frame comprises a first frame surface positioned adjacent the first side of the planar device body and the first frame surface is configured to receive at least one of the first sidebar unit and the second sidebar unit to couple the at least one of the first sidebar unit and the second sidebar unit to the first side of the planar device body.

3. The mobile device of claim 2, wherein the first sidebar unit and the second sidebar unit each further comprise:
   an inner surface having at least one locking feature; and
   an exterior surface.

4. The mobile device of claim 3, wherein the frame further comprises at least one sidebar mount feature positioned on the first frame surface;
   wherein the at least one locking feature is engageable to the at least one sidebar mount feature to couple at least one of the first sidebar unit and the second sidebar unit to the first side of the frame.

5. The mobile device of claim 4, wherein the at least one locking feature comprises a t-shaped feature and the at least one sidebar mount feature comprises a slot for slidably receiving the t-shaped feature.

6. The mobile device of claim 4, wherein the planar device body further comprises:
   a front plate mountable to the frame; and
   a rear plate mountable to the frame opposite to the front plate to maintain engagement of the at least one locking feature to the at least one sidebar mount feature.

7. The mobile device of claim 6, wherein at least one of the front plate and the rear plate is mounted to the frame prior to engagement of the at least one locking feature to the at least one sidebar mount feature;
   wherein the other of the front plate and the rear plate is mounted to the frame after engagement of the at least one locking feature to the at least one sidebar mount feature to maintain engagement of the at least one locking feature to the at least one sidebar mount feature.

8. The mobile device of claim 3, wherein the at least one of the first sidebar unit and the second sidebar unit each further comprise a button portion defining an internal space, wherein the at least one first button and the at least one second button are configured to be depressed to move the corresponding button at least partially into the internal space.

9. The mobile device of claim 8, wherein a metal dome is positioned in the internal space such that depressing the corresponding button actuates the metal dome to produce at least one of an auditory or a tactile click.

10. The mobile device of claim 8, wherein a flex switch is positioned within the internal space such that depressing the corresponding button actuates the flex switch to complete a circuit.

11. The mobile device of claim 10, wherein the button portion further comprises:
    at least one sidebar contact positioned on the inner surface of the at least one of the first sidebar unit and the second sidebar unit.

12. The mobile device of claim 11, wherein one of the first frame contacts and the second frame contacts is operably connected to a controller and positioned to engage the at least one sidebar contact when the at least one of the first sidebar unit and the second sidebar unit is coupled to the frame;
    wherein depressing the corresponding button signals the controller through the at least one sidebar contact engaged to the at least one frame contact.

13. The mobile device of claim 12, wherein the frame further comprises:
    a recessed portion for receiving the button portion;
    wherein the recessed portion includes at least one angled portion for guiding the at least one frame contact into engagement with the at least one sidebar contact.

14. The mobile device of claim 2, wherein the frame further comprises:
    a second frame surface positioned opposite the first frame surface;
    wherein the second frame surface corresponds to the second side of the planar device body opposite the first side of the planar device body.

15. The mobile device of claim 14, wherein the second frame surface is configured to receive the other of the first sidebar unit and the second sidebar unit to couple the other of the first sidebar and the second sidebar to the second side of the planar device body.

16. The mobile device of claim 15, wherein the first side of the planar device corresponds to a left side of the planar device and the second side of the planar device corresponds to a right side of the planar device;
    wherein reversing the first sidebar unit from the first side to the second side and the second sidebar unit from the second side to the first side reverses the mobile device from a left-handed configuration to a right-handed configuration.

17. A method for providing a mobile device having a desired button configuration, the mobile device including a frame having a first frame contact and a second frame contact, the method comprising:
  providing a planar device body having a first side and a second side opposite the first side;
  selecting one sidebar of a first sidebar unit and a second sidebar unit, wherein the first sidebar unit is configured to be coupled to either of the first side or the second side and the second sidebar unit is configured to be coupled to the other of the first side or the second side; and
  coupling the selected one sidebar of the first sidebar and the second sidebar to the first side of the planar device body, the first sidebar having a plurality of buttons arranged in a first button configuration and the second sidebar having at least one second button arranged in a second button configuration different from the first button configuration, wherein each of the first frame contact and the second frame contact are configured to alternatively receive the plurality of buttons of the first sidebar unit and the at least one second button of the second sidebar unit.

18. The method of claim 17, wherein the frame comprises a first frame surface positioned adjacent the first side of the planar device body and a second frame surface positioned adjacent the second side of the planar device body.

19. The method of claim 18, further comprising:
  coupling the selected one sidebar of the first sidebar unit and the second sidebar unit to the first frame surface to couple the one sidebar of the first sidebar unit and the second sidebar unit to the first side of the planar device body.

20. The method of claim 19, wherein the frame further comprises a second frame surface positioned opposite the first frame surface, wherein the second frame surface corresponds to the second side of the planar device body opposite the first side of the planar device body.

21. The method of claim 20, further comprising:
  coupling the other sidebar unit of the first sidebar unit and the second sidebar unit to the second frame surface to couple the other sidebar unit of the first sidebar unit and the second sidebar unit to the second side of the planar device body;
  wherein the first sidebar unit and the second sidebar unit are interchangeably connected to the first and second frame surfaces.

22. The method of claim 21, wherein the first side of the planar device corresponds to a left side of the planar device and the second side of the planar device corresponds to a right side of the planar device.

23. The method of claim 22, further comprising:
  reversing the first sidebar unit from the first side to the second side and the second sidebar unit from the second side to the first side to reverse the mobile device from a left-handed configuration to a right-handed configuration.

24. A mobile device, comprising:
  a planar device body having a first side and a second side opposite the first side;
  a first sidebar unit configured to be coupled to the first side or the second side, the first sidebar unit having a plurality of buttons arranged in a first button configuration;
  a second sidebar unit configured to be coupled to the second side having at least one second button arranged in a second button configuration different from the first button configuration,
  wherein when the first sidebar unit is coupled to the first side and the second sidebar unit is coupled to the second side, the mobile device is in a left-handed configuration,
  wherein when the second sidebar unit is coupled to the first side and the first sidebar unit is coupled to the second side, the mobile device is in a right-handed configuration; and
  a frame configured to receive the first sidebar unit and the second sidebar unit, the frame having a first frame contact on the first side of the planar device body and a second frame contact on the second side of the planar device body where each of the first frame contact and the second frame contact are configured to alternatively receive either the plurality of buttons of the first sidebar unit and the at least one second button of the second sidebar unit.

* * * * *